(12) United States Patent
D'Couto et al.

(10) Patent No.: US 6,342,133 B2
(45) Date of Patent: *Jan. 29, 2002

(54) PVD DEPOSITION OF TITANIUM AND TITANIUM NITRIDE LAYERS IN THE SAME CHAMBER WITHOUT USE OF A COLLIMATOR OR A SHUTTER

(75) Inventors: Gerard Chris D'Couto, San Jose; George Tkach, Santa Clara; Jeff Dewayne Lyons, Hayward; Max Biberger, Palo Alto; Kwok Fai Lai, Palo Alto; Jean Lu, Palo Alto; Kaihan Ashtiani, Sunnyvale, all of CA (US)

(73) Assignee: Novellus Systems, Inc., San Jose, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

This patent is subject to a terminal disclaimer.

(21) Appl. No.: 09/524,987

(22) Filed: Mar. 14, 2000

(51) Int. Cl.$^7$ .............................................. C23C 14/35
(52) U.S. Cl. .......................... 204/192.17; 204/192.15; 204/192.22

(58) Field of Search ....................... 204/192.12, 192.15, 204/192.17, 298.17, 298.18, 298.16, 192.22

(56) References Cited

U.S. PATENT DOCUMENTS

| 4,810,347 A | * | 3/1989 | Smith ................... 204/298.18 |
| 4,855,033 A | * | 8/1989 | Hurwitt ................. 204/298.18 |
| 5,240,880 A | * | 8/1993 | Hindman et al. ...... 204/192.17 |
| 5,242,860 A | * | 9/1993 | Nulman et al. ............ 438/653 |
| 5,334,302 A | * | 8/1994 | Kubo et al. ............ 204/298.18 |
| 5,401,675 A | | 3/1995 | Lee et al. |
| 5,427,666 A | | 6/1995 | Mueller et al. |
| 5,482,611 A | | 1/1996 | Helmer et al. |
| 5,643,422 A | * | 7/1997 | Yamada ................. 204/192.15 |
| 5,738,917 A | | 4/1998 | Besser et al. |
| 5,744,016 A | | 4/1998 | Yamada et al. |
| 5,858,183 A | | 1/1999 | Wolters et al. |
| 6,071,390 A | * | 6/2000 | Kobayashi ............. 204/298.19 |
| 6,179,973 B1 | * | 1/2001 | Lai et al. ............... 204/298.16 |
| 6,180,522 B1 | * | 1/2001 | Hong ......................... 438/659 |

* cited by examiner

*Primary Examiner*—Rodney G. McDonald
(74) *Attorney, Agent, or Firm*—Lathrop & Gage L.C.; Thomas Swenson

(57) ABSTRACT

Ti and TiN layers are formed on an integrated circuit substrate using a titanium target in non-nitrided mode in a hollow cathode magnetron apparatus. Neither a collimator nor a shield is used. Ti and TiN layers are deposited in vias and trenches having aspect ratios up to 5:1.

12 Claims, 4 Drawing Sheets

PVD DEPOSITION OF TITANIUM AND TITANIUM NITRIDE LAYERS IN THE SAME CHAMBER WITHOUT USE OF A COLLIMATOR OR A SHUTTER

BACKGROUND OF THE INVENTION

1. Field of the Invention

The invention relates to a method of manufacturing semiconductor devices whereby a Ti layer and a TiN layer are deposited on integrated circuit substrates in a single PVD deposition chamber without using either a collimator or a shutter.

2. Statement of the Problem

In modern integrated circuit ("IC") technology, a metallization comprising a Ti layer, a TiN layer and a top conductive layer is often provided on a surface of a semiconductor body. The Ti layer serves to obtain a good adhesion and a low contact resistance between the metallization and the semiconductor body. When a layer of Al or Al alloyed with a few percent of Si or Cu is used as the conductive top layer, the TiN layer serves as a barrier to prevent chemical reactions of the Al with the Ti layer and the semiconductor material situated underneath the barrier layer. When W is used as a conductive top layer, deposited by means of a usual chemical vapor deposition ("CVD") process for which $WF_6$ is used, the TiN serves as a barrier to prevent chemical reactions between Ti and F which is formed during such a CVD process. Thus, a typical IC fabrication process includes forming a stack of layers represented by Al/TiN/Ti/$SiO_x$/Si or W/TiN/Ti/$SiO_x$/Si.

In addition, anti-reflective coatings are frequently used in semiconductor processing to reduce light reflectance on the surface of metallic layers. Aluminum is widely used as a metallization layer material due to its low melting point, high conductivity and low cost. However, one drawback of Al is that the surface of Al is highly reflective. This high surface reflectivity greatly hampers the imaging process necessary for lithography. During a lithographic process, a photoresist layer must be deposited on the Al surface based on a photographical pattern previously formed in a photo-imaging mask. The high reflectivity from the surface of Al renders this photographic transfer process extremely difficult. To reduce the high reflectivity of Al, an anti-reflective coating ("ARC") layer of TiN can be deposited on the surface of Al. The TiN layer appears as a brown or golden tint which significantly reduces the reflectivity of Al from near 100% to approximately 20% at the wavelengths of visible light. This ARC deposition process is a very important step in semiconductor processes whenever aluminum or other highly reflective metal layer is used.

Thus, a typical stack arrangement on an IC semiconductor substrate may include a Ti contact layer on the semiconductor surface, a TiN barrier layer, an Al interconnect layer, and a TiN ARC layer for the purpose of reducing optical reflection. Such a stack may be represented by TiN/Al/TiN/Ti/$SiO_x$/Si.

Various plasma vapor deposition ("PVD") sputtering techniques known in the art for depositing TiN/Ti stacks may be categorized as either nitrided mode ("NM") or non-nitrided mode ("NNM") techniques. In the NM (nitrided mode), typically a titanium target is placed in a sputter chamber, and the TiN layers are deposited by sputtering titanium with a sputter gas in the presence of nitrogen. For example, in a typical PVD technique, argon ("Ar") gas supports a plasma used in plasma sputtering while the $N_2$-gas reacts with the sputtered Ti to form TiN. In a NM technique, the titanium target is inundated with nitrogen atoms, becoming "nitrided", such that a coating of TiN forms on the surface of the titanium target. This decreases the overall deposition rate of the desired layer of TiN onto the IC substrate because the nitrogen in the titanium target interferes with the sputtering of titanium. Another disadvantage is that the titanium target used to deposit TiN cannot then be used to deposit Ti. As a result, separate deposition chambers are required for each stage involving deposition of Ti and TiN. For example, in a conventional process to make a TiN/Al/TiN/Ti/$SiO_x$ stack, a PVD four-chamber cluster system includes Ti targets in three chambers and an Al target in one chamber. The Ti contact layer is deposited by maintaining a partial pressure of Ar gas in the respective chamber, while the TiN layers are deposited by maintaining a partial pressure of Ar and $N_2$ gases in the respective process chambers.

It is known in the art to use a shutter that allows deposition of Ti and TiN in the same deposition chamber. A Ti layer is first deposited using a Ti target. Then, a TiN layer is deposited on the Ti layer using the same Ti target in a NM. During TiN deposition in NM, the Ti target becomes nitrided. Before depositing the Ti layer on the next wafer, the shutter is inserted between the target and the wafer, and the target is sputtered in the absence of nitrogen gas to sputter away the nitrided parts. The target is thereby returned to its clean, metallic state and is ready for the sputtering of pure Ti.

To reduce the inefficiency of using a shutter or separate chambers for Ti and TiN deposition, modifications in the sputtering sequence have been suggested in the prior art. U.S. Pat. No. 5,858,183, issued Jan. 12, 1999, to Wolters et al., and U.S. Pat. No. 5,738,917, issued Apr. 14, 1998, to Besser et al, disclose NM techniques in which an extra Ti layer is deposited on a TiN layer before deposition of the aluminum layer, resulting in a Al/Ti/TiN/Ti/substrate stack. During the deposition of a TiN layer in the nitrided mode (NM), a plasma is generated in a gas mixture comprising Ar and $N_2$ near the Ti target. A nitrided layer comprising nitrogen is created thereby on the Ti target during this deposition step. During an extra process step, the titanium target is sputtered in the absence $N_2$ gas, resulting in deposition of an extra Ti layer containing nitrogen atoms. The extra sputtering step is intended to sputter away the nitrogen in the nitrided titanium target, returning it to a pure Ti, or metallic, state. If sufficiently cleaned, the Ti target is ready to deposit only Ti atoms on the surface of the next wafer being processed. This approach reduces the number of chambers being used. This known method has the disadvantage, however, that the extra layer comprising free Ti is deposited on top of the TiN layer. If a conductive top layer of Al or Al alloyed with a few percents of Si or Cu is provided thereon, the Al and free Ti atoms react with one another, forming compounds with a comparatively high electrical resistance. As a result, the conductive Al layer must then be provided to a comparatively large thickness in order to ensure that conductor tracks having a comparatively low resistance can be formed in the layer structure thus created. If a W layer is deposited on the extra Ti layer comprising free Ti by means of a usual CVD process in which $WF_6$ is used, then the free Ti reacts with F formed during such a CVD process. This leads to the formation of $TiF_3$, to which W has a bad adhesion.

A similar approach is disclosed in U.S. Pat. No. 5,607,776, issued Mar. 4, 1997 to Mueller et al., which teaches deposition of an extra Ti layer onto a TiN-ARC layer, resulting in a Ti/TiN/Al/TiN/Ti/substrate stack. Even though Mueller et al. teach a thin layer of Ti, the extra Ti layer is very reflective and reduces the effect of the TiN-ARC layer. Furthermore, these conventional methods have the disadvantage of adding a process step to an already slow NM technique.

As IC structures have become more compact, the need for low resistance metal interconnects between these structures has increased. Tungsten deposited by CVD and aluminum doped with Cu or Si have been used recently in the industry to provide these interconnections. In the up-to-date semiconductor device, interconnection holes (contact holes or vias), which are provided in the interlayer dielectric ("ILD") layer between the circuit elements and the wiring, have become narrower and relatively deeper, and it is difficult to form tungsten or Al alloy in contact holes by a sputtering process. As a result, low pressure chemical vapor deposition ("LPCVD") techniques having good step coverage have been adopted for filling contact holes with a tungsten (W) plug. A W layer, however, tends to peel off a substrate because of its low adhesive strength to ILDs. Further, if W is directly grown on Si, then precursor $WF_6$ gas and Si, the typical semiconductor substrate, often react with each other to destroy the circuit elements. Therefore, as with Al metallization layers, instead of forming a W film or plug on the substrate directly, a Ti liner layer is formed at the bottom of a via, a TiN barrier layer is formed on the Ti, and then W is grown thereon to fill the via. In this case, in order to completely prevent destruction of the IC elements, at least 10 nm of the TiN film is typically necessary on the bottom of a via or contact hole.

Conventional sputtering of Ti and TiN provides satisfactory results when used on a planar surface or when used to coat the sidewalks and bottom of an aperture (or via), where the ratio of the height of the aperture to its width, hereinafter the "aspect ratio" ("AR") of the via, is less than 1:1. However, as the aspect ratio of the via increases, conventional sputtering does not provide acceptable results. Specifically, far less material is deposited at the bottom portions of the via or hole than at the top, since the walls "shadow" the lower exposed surface. The deposited material at the upper surfaces increasingly accentuates the shadowing effect, thereby prematurely closing the upper section of the via and preventing effective fill of the lower section. For example, with a conventional sputter method, bottom coverage is only about 5% in a via having an AR of 5:1.

Accordingly, it has been a goal of manufacturers of sputtering systems to provide means for imparting greater directionality to the ejected target atoms that reach the wafer. Ideally, for filling vias and grooves, sputtered atoms should arrive at an angle which is normal to the plane of the wafer.

Therefore, in order to improve the deposition of Ti and TiN into vias, apertures and contact holes (hereinafter "vias"), collimation sputtering techniques have been developed in the art. A known method of imparting greater directionality to the atoms reaching the wafer surface is to install a collimating filter between the source and the substrate. Such a filter might comprise a network of elongate cell-like structures, each cell having an axis perpendicular to the surface of the substrate. Atoms traveling approximately perpendicular to the substrate surface travel through the cells unimpeded. Atoms traveling at an acute angle are intercepted by a wall of one of the cells and captured. The use of a collimator allows deposition of Ti and TiN in vias with aspect ratios up to about 2 or 3. This approach, while providing good directionality, is also inefficient since much of the target material is wasted and builds up on the cell walls. The buildup of material can lead to an undesired increase in the number of particulates in the system, making it necessary to replace or clean the collimator frequently. Since most of the sputtered material does not pass through the collimator and is wasted, the deposition rate is slow and the rate of consumption of targets is high. By gradually increasing the sputter power, a practical growth rate can be obtained in forming the TiN film. However, when increasing the sputter power, it is also necessary to increase the flow rate of nitrogen. When TiN is formed on the surface of the target, the growth rate of the TiN film is reduced to less than one-third under the same sputter power as compared with the case in which Ti film is formed by the sputtering process.

On the other hand, a collimator can be used in a NNM process, in which $N_2$ gas enters the deposition chamber towards the wafer substrate and is prevented from passing through the collimator towards the target by the flow of Ti atoms. However, in such a process, it is necessary to exactly balance and control the sputter power and the flow rates of inert Ar and $N_2$ gases. Such control is difficult, and the Ti targets often become nitrided. In any case, when used in either a NM or a NNM mode, a collimator eventually becomes covered with deposits of Ti and TiN material. The deposited material tends to flake off the collimator, resulting in contamination of the IC substrate.

Conventional PVD sputtering is accomplished by creating at a relatively low pressure a plasma comprising, typically, an inert gas, such as argon (Ar), in the vicinity of a target cathode which is made of the material to be deposited. Positively charged plasma atoms, known as ions, then strike the target cathode, causing atoms of the target cathode to be ejected into the plasma. These target atoms then travel through the sputtering vacuum and are deposited onto the semiconductor substrate. Conventional diode PVD sputtering is inefficient and, in some instances, incapable of providing required directionality to thin films when fabricating VLSI and ULSI circuits. The plasma that is created with a standard PVD sputtering device lacks a sufficient amount of ionized target material atoms. The degree of ionization of a plasma is referred to in the art as the plasma intensity. The more intense the plasma, the greater the ability to steer and focus the plasma and, thus, impart an adequate amount of directionality to the ions in the plasma. Thus, another approach to improving the ability of a sputter source to fill grooves and vias has been to apply additional RF power to the sputtered species. This is done by applying RF power to a band of material that is the same as the target. This RF power capacitively couples into the neutral plasma, and increases the ionization of the neutral atoms. The disadvantages with this method is that the band also gets sputtered, and becomes a consumable. Additionally, the sputtering of the band can increase the amount of particles created.

To overcome the limitations of conventional PVD sputtering, the use of magnetic fields in magnetron sputtering devices has been introduced in the art. As with standard sputtering devices, a magnetron sputtering apparatus generally comprises a vacuum chamber which confines a plasma forming gas, typically an inert gas, such as argon (Ar), at a relatively low pressure, typically 3 to 5 millitorr. An electrical field (E) is then created within the vacuum chamber by applying a negative potential at the target cathode and creating an anode, typically, by means of grounding the overall sputter chamber. A magnetic field (B) is introduced into the vacuum chamber, typically in an orientation such that the field lines loop through the target cathode for the purpose of creating and confining a plasma near the target. As positive ions from the plasma strike the target, atoms are ejected from the surface of the target. The magnetic field serves to attract an electron-rich portion of the plasma in the vicinity of the target. In addition, electrons trapped about the target allow for an increase in the collisions between the neutral atoms ejected from the surface of the target and the rapidly moving electrons. By increasing the quantity of collisions, the likelihood increases that a neutral ejected target atom will be struck by a sufficiently energetic particle within the plasma, thus causing the ejected target atom to lose one or more electrons and result in an ionized atom. By increasing the quantity of ionized target atoms within the plasma, the plasma density, or intensity, increases. As the plasma intensity increases, so does the probability that further ionization of ejected target atoms will occur.

Conventional magnetron and rf-iPVD sputtering techniques are limited in their efficiency due in part to the fact that the vast majority of metal atoms ejected from the target remain neutral. Even with the use of a magnetic field to trap plasmas about the target cathode, the intensity of the plasma remains insufficient and upwards of 98% or greater of the target material atoms remain un-ionized as they travel through the sputter chamber to the substrate. As with other PVD techniques, Ti-atoms are ejected from the surface of the sputter target at a random angle and the mean-free path of travel between the target cathode and the substrate for these neutral metal atoms is reduced by random collisions with other target atoms or inert gas ions. When the predominantly neutral atoms in these plasmas do come in contact with the substrate, they characteristically do so over a wide range of angles, generally conforming to a cosine distribution. In particular, when atoms are disposed on substrate surfaces at angles less than normal, it poses significant difficulty in uniformly filling trenches and interconnect vias. U.S. Pat. No. 5,744,016, issued Apr. 28, 1998, to Yamada et al., discloses a known planar magnetron sputtering apparatus having a titanium sputter target, a collimator plate, and shield plates. The collimator is supposed to impart the requisite directionality to the sputtered material, and the shield plates are supposed to prevent formation of TiN on the collimator. The overall efficiency of such a system is very low, however, because most of the sputtered material remains un-ionized or is trapped by the shield plates.

SOLUTION

The present invention provides a novel method in which Ti and TiN can be formed on an integrated circuit substrate in the same PVD chamber without use of either a shutter or a collimator. A method in accordance with the invention includes use of a hollow-cathode sputtering target containing titanium. The titanium-containing target is sputtered in a non-nitrided mode ("NNM") in the deposition chamber of a hollow-cathode magnetron ("HCM") apparatus to deposit a TiN layer on an integrated circuit substrate. Since both a Ti layer and TiN layer can be deposited on the substrate in the same deposition chamber, processing chambers in fabrication equipment are more efficiently used, and fabrication steps are simplified compared to prior art processes conducted in a plurality of chambers or done in a nitrided mode ("NM"). Sputtering of a HCM Ti target without use of a collimator or a shutter results in less target material being wasted than in prior art methods. The chances of flaking of material onto the IC substrate is reduced. The deposition rates of the Ti and TiN layers is faster than in apparati and methods of the prior art. For example, NNM operation in accordance with the invention provides deposition rates of 70 nm/min or more and bottom coverage greater than 30 percent while fabricating a TiN layer in a via having an aspect ratio ("AR") of 5:1. Also, an apparatus and a method in accordance with the present invention provide formation of high quality layers of Ti and TiN for metallizations and local interconnects having high aspect ratios. For example, a TiN film fabricated in accordance with the invention with a thickness of 100 nm has a resistivity of only about 30 $\mu$ohm-cm.

A method in accordance with the invention for depositing Ti and TiN on an integrated circuit substrate comprises steps of: providing a hollow cathode target having a cavity region and containing titanium; sputtering titanium from the target to form a layer containing Ti on the substrate; and sputtering titanium from the target and simultaneously flowing a nitrogen-containing gas into a deposition chamber to form a layer containing TiN on the substrate. A magnetic field is created that has a magnetic null region located between the cavity region and the substrate and which imparts directionality to Ti-ions traveling towards the substrate.

A method may further comprise: heating the substrate, preferably to a temperature in a range of from 250° C. to 350° C.; applying an amount of power in a range of from 20 to 36 kilowatts to the target, thereby creating a negative voltage in a range of from –400 to –500 volts at the hollow cathode target; and applying a current not exceeding 1.0 amps to an electromagnetic coil to modify the magnetic field. In certain embodiments of the invention, the hollow target cathode and the substrate may be separated by a distance of from 215 to 240 mm. A method in accordance with the invention may be used to deposit layers of Ti and TiN having thicknesses up to several microns, the final thickness being limited by the amount of Ti target material. In typical integrated circuit fabrication, however, the thickness of a Ti layer formed is typically in a range of from 10 to 70 nm, and the thickness of a TiN layer formed is typically in a range of from 10 to 100 nm.

DETAILED DESCRIPTION OF THE INVENTION

Figure 1:
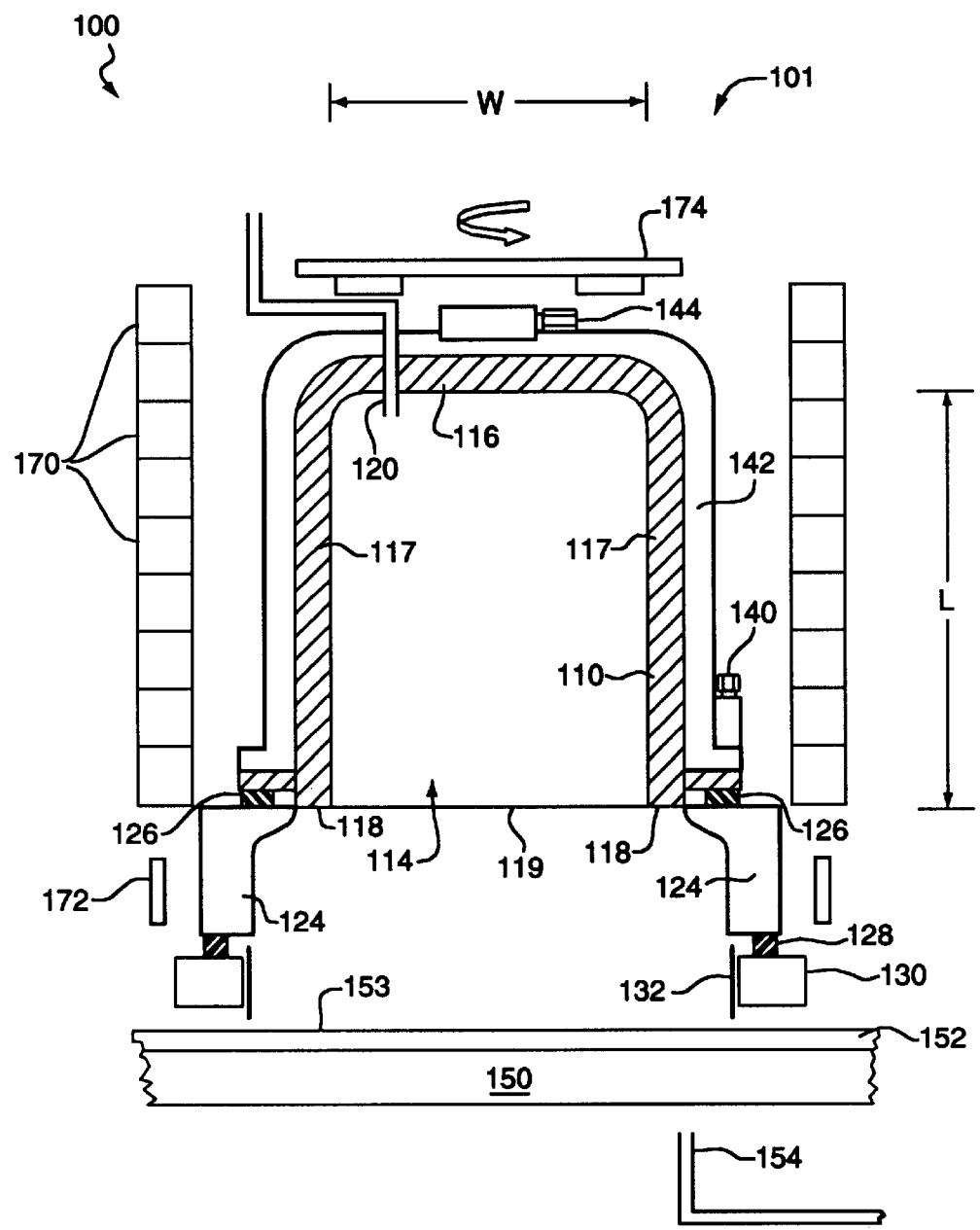
FIG. 1 is a schematic cross-sectional view of a portion of a high-intensity magnetron sputter apparatus having a hollow-cathode magnetron ("HCM") assembly useful in practicing the present invention.

FIG. 1 is a schematic cross-sectional view of a portion of high-intensity magnetron sputter apparatus 100 having a hollow-cathode magnetron ("HCM") assembly 101, of a type which is useful in practicing the present invention. A general HCM apparatus is described in U.S. Pat. No. 5,482,611, issued Jan. 9,1996, to Helmer et al., which is hereby incorporated by reference as if fully contained herein. Improved embodiments of HCM apparati and methods are described in copending and co-owned United States patent applications: Ser. No. 09/375,667, filed Aug. 16, 1999; Ser. No. 09/345,466, filed Jun. 30, 1999; Ser. No. 09/088,420, filed Jun. 1, 1998; and Ser. No. 09/073,358, filed May 6, 1998, which are hereby incorporated by reference as if fully contained herein. TiN/Ti deposition in accordance with the present invention is a result of a novel application of an HCM and a novel method of operation in this mode.

HCM assembly 101 includes a hollow target cathode 110 having a hollow, generally cup-like cavity region 114 comprising a planar bottom 116 of diameter W, a cylindrical wall 117 of height L from planar bottom 116 to cylindrical end 118, and an opening 119. Hollow target cathode 110 serves as the sputter target for depositing Ti and TiN in NNM and is, therefore, made of titanium. As will be described in further detail below, the plasma formed in HCM sputter apparatus 100 is concentrated within the hollow cavity region 114 of hollow target cathode 110. As a consequence, sputtering occurs from within cavity region 114. Width W is preferably less than 2.5 cm and less than L. Inert gas inlet 120 is located within cavity region 114 to allow introduction of an inert gas, such as argon, which is used to form a plasma. The HCM assembly confines sputtered atoms to make an intense plasma.

A floating anode ring 124 is used to create a potential difference with respect to hollow target cathode 110, which may be held at several hundred volts negative. At the gas pressures typically used, and in view of the geometry shown, a voltage between −400 V and −500 V may be used. Cylindrical ceramic insulator 126 electrically isolates anode 124 from hollow target cathode 110.

HCM assembly 101 further includes adapter ring 130, grounded anode shield 132, and ceramic insulator 128. While spatially and electrically isolated from the cathode, anode shield 132 is typically placed in close proximity to the hollow cathode, as depicted in FIG. 1. Anode shield 132 functions as a sputtering shield. It is positioned between the HCM assembly 101 and the substrate surface 153. It collects errant Ti atoms that are not deposited on substrate surface 153. Without a shield in place, the errant Ti atoms would deposit on other components of the HCM sputtering apparatus. If errant Ti atoms were to deposit on structures other than the shield, they would form brittle deposits that are prone to flaking off and potentially causing damaging particulate matter to enter into the TiN/Ti stack being deposited. In addition, Ti atom build-up on structures other than anode shield 132 would pose the threat of damaging more costly components of the sputtering apparatus. Anode shield 132 is typically constructed from stainless steel or aluminum; it is also advantageous to construct the shield from titanium to avoid a thermal mismatch between the shield and the Ti-containing plasma.

HCM assembly 101 also includes a cooling water inlet 140, water cooling jacket 142 and cooling water outlet 144. Cooling provided by cooling water jacket 142 prevents overheating of hollow target cathode 110. A substrate holder 150 serves to support an integrated circuit substrate 152. During NNM operation, nitrogen-containing gas, typically $N_2$-gas, enters the deposition chamber, but outside of cavity region 114. Nitrogen gas inlet 154 is typically located away from hollow target cathode 110 to prevent nitrogen from reaching the titanium target. HCM assembly 101 further includes stacked annular magnets 170, electromagnetic coil 172, and rotating magnet 174.

HCM assembly 101 is designed to be operated within a vacuum deposition chamber, not shown. It is apparent to those skilled in the art that an HCM assembly, like that shown in FIG. 1, can readily be constructed such that only the front portion, i.e., the portion facing wafer 152, is within the vacuum deposition chamber. With proper sealing, the backside of the apparatus can be held at atmospheric pressure.

Figure 2:
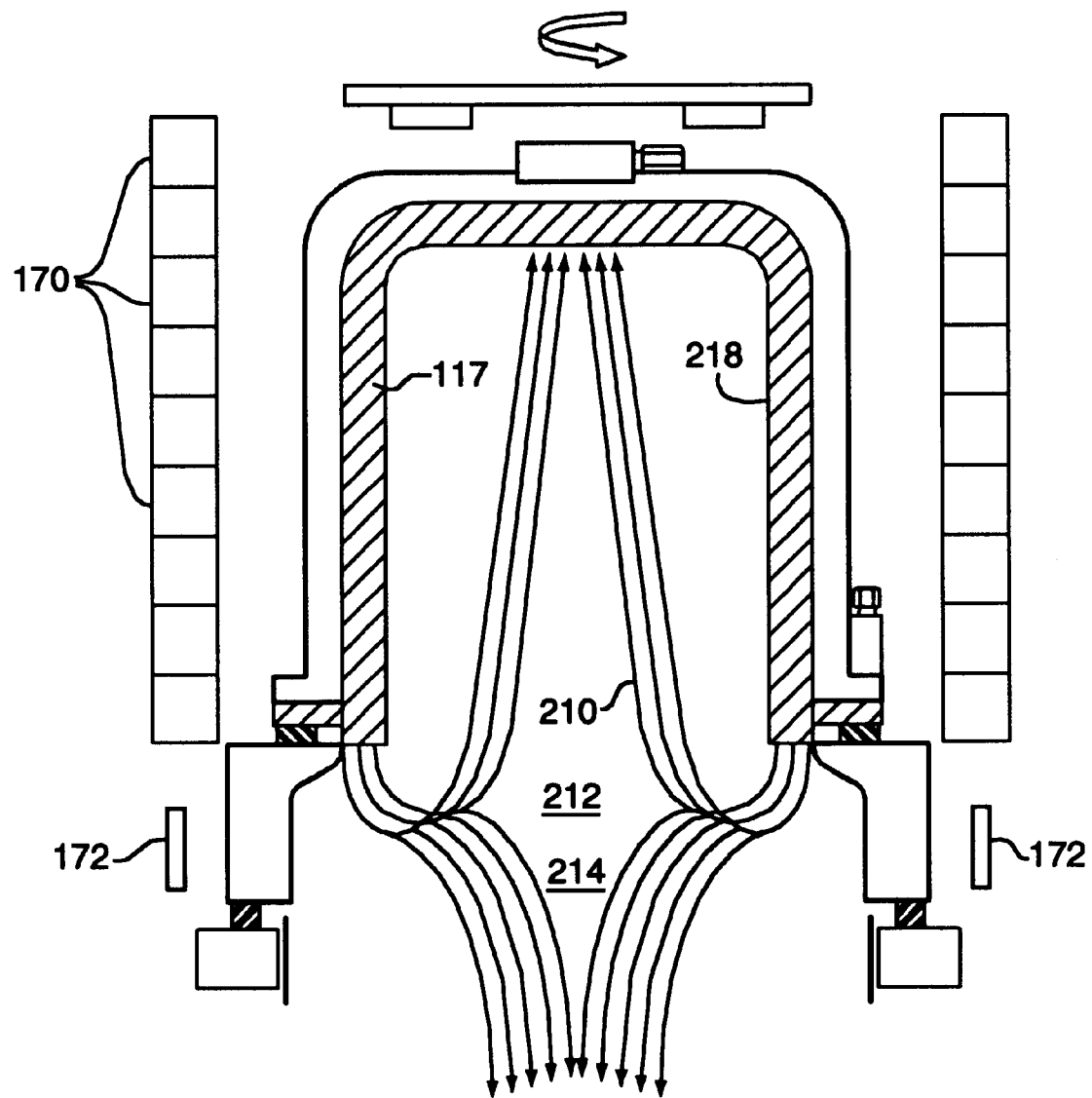
FIG. 2 depicts a magnetic field having field lines that loop through the side walls of the hollow target cathode of FIG. 1, and which also form a magnetic null-field region.

As depicted in FIG. 2, stacked annular magnets 170 create a magnetic field having field lines 210 that loop through the side walls 117 of hollow target cathode 110, but which also form a magnetic null-field region 212 immediately outside opening 119 of cavity region 114 of hollow target cathode 110. Preferably, magnets 170 are permanent magnets, creating a permanent magnetic field, which is modified by electromagnetic coil 172 during a deposition method in accordance with the invention in order to improve magnetic field lines 210 and magnetic null region 212. Magnetic null region 212 traps and retains ions and electrons inside the hollow target cathode except for those particles which have entered into the null region 212 at the upper edge 214 of the region 212 with axial velocity and very little radial velocity. The term "axis" herein refers to the axis located at the center of cylindrical hollow target cathode 110 and which is normal to the plane of substrate 152 in FIG. 1. The term "axial" and related terms herein refer to the direction of the center axis of hollow target cathode towards substrate 152. Ions and electrons which have primarily axial velocity are able to leave the hollow target cathode along the axis at upper edge 214 of null region 212 in FIG. 2 and travel to substrate surface 153. Other particles are reflected back and retained in the hollow target cathode.

In addition, the arrangement of magnets 170 provides magnetic field lines inside of hollow target cathode 110 which loop around so that the magnetic field lines are parallel to the surfaces 218 of walls 117 and cause trapping of the electrons and ions in the plasma in the vicinity of the hollow target cathode walls 117, as in standard sputter magnetron fashion.

Width W and depth L of hollow target cathode 110 are on the same order dimensionally. This configuration provides a high probability that sputtered neutral target atoms that leave surface 218 of walls 117 of hollow target cathode 110, which is the Ti sputter target, are either ionized by the highly intense plasma or redeposited on an opposite wall and then resputtered back.

Generally, the vacuum deposition chamber (not shown) is evacuated to a sufficiently low pressure, which may be, for example, $10^{-5}$ torr or less. A small quantity of an inert gas, such as argon, is introduced into the vacuum chamber raising the pressure in the chamber to 1–5 millitorr, for example. In a preferred embodiment, argon is introduced directly into the cathode cavity region 114 via inlet 120 so that it is present in greatest concentration where the plasma discharge is to be initiated. By introducing the plasma gas directly into the cavity region, it is possible to lower the overall system operating pressure. A plasma discharge is then created, in a known manner, by applying a high negative voltage on hollow target cathode 110. The plasma is concentrated by the magnetic field lines 210 primarily into an area adjacent to surface 218 of target cathode 110. Gas ions are formed in the plasma and strike the surface of the sputter target cathode, causing neutral Ti-atoms to be ejected from the surface of the target. Generally speaking, the direction of travel of an ejected atom may be in any random direction. As the magnetic field moves outward toward opening 119 of cavity region 114, the magnetic field gradually declines until it reaches a point where the magnetic field has completely dissipated; that is, the magnetic null. The magnetic null, which is unique to the geometry of the magnetic field source and target cathode within an apparatus, exists outside of the hollow cavity region 114 of the target cathode 110, a short distance from opening 119 in hollow cathode target 110. It is at this magnetic null region where the plasma that exists in the hollow cathode target is separated from the plasma beam which flows toward the substrate surface 153. Beyond the distance where the magnetic null exists, a remnant reversing magnetic field, $B_{rev}$, exists. The remnant reversing magnetic field typically reaches a maximum of about 50 gauss a short distance from the magnetic null, and then decays asymptotically towards zero as it approaches the surface requiring thin film layering. If this remnant reversing magnetic field is not counteracted, a small, but potentially damaging, magnetic field may contact the substrate and threaten charging damage. Electromagnetic coil 172 is connected to a power supply (not shown in FIG. 1) and is positioned within the hollow cathode magnetron deposition chamber so that the opposing or bucking magnetic field that electromagnetic coil 172 generates interacts almost exclusively with the remnant reversing magnetic field. This is achieved by positioning the electromagnetic coil 172 at a distance just beyond the magnetic null region. By varying the electrical current supplied to the electromagnetic coil, the magnetic field generated by the coil can be increased or decreased, accordingly. By adjusting the strength of the electromagnetic coil's bucking magnetic field, the remnant reversing magnetic field is harnessed. For example, the coil current can be tuned to almost fully negate the remnant reversing magnetic field, thus allowing a large, almost magnetic-field-free region to exist beyond the magnetic null. In effect, the magnetic null region has been expanded, allowing the plasma beam to diffuse freely in the field free region and achieve superior ion uniformity throughout the diffused plasma beam. The use of a current variable electromagnetic coil is particularly useful when optimization of plasma uniformity is essential. Thus, this is useful for the deposition of Ti and TiN layers because it allows instantaneously adjusting the spread of the plasma beam, and thus the ion uniformity, while forming a TiN/Ti stack. In addition, by greatly reducing the strength of the remnant magnetic field, it lessens the likelihood that the devices on the substrate will be subjected to charging damage.

The plasma of the present invention is sufficiently intense to cause ionization of not only the gas atoms, but also of a large number of the sputtered Ti-atoms. The high intensity plasma of the present invention typically has a density of $10^{13}$ particles/cc. This high intensity is brought about in part by the ability of the hollow cathode magnetron to increase the Ti-ion count well beyond previous magnetron sputtering devices used for TiN/Ti deposition. The sputtering which ensues in the hollow cathode magnetron is predominantly of Ti-ions, rather than neutral particles. These ionized particles are far more susceptible to being steered and/or focused to the substrate surface. By imparting directionality to the Ti-ions in the plasma, an overall improvement in sputtering operations is seen in the ability to impart required step coverage in high AR vias and trenches. When the Ti-ions in the plasma are directed towards the substrate in a more perpendicular fashion, as opposed to the random impingement of prior art sputtering mechanisms dominated by neutral particles, proper step coverage and trench-filling can be realized.

While Ti-ions deposited in accordance with the invention are much more energetic than neutral atoms deposited using prior art sputtering techniques, they are not so energetic as to cause damage to the substrate. In particular, ions having an energy of less than approximately 100 ev do not cause damage to the wafer substrate. This damage-causing level is well above the energy of the ions deposited using the present invention.

Figure 3:
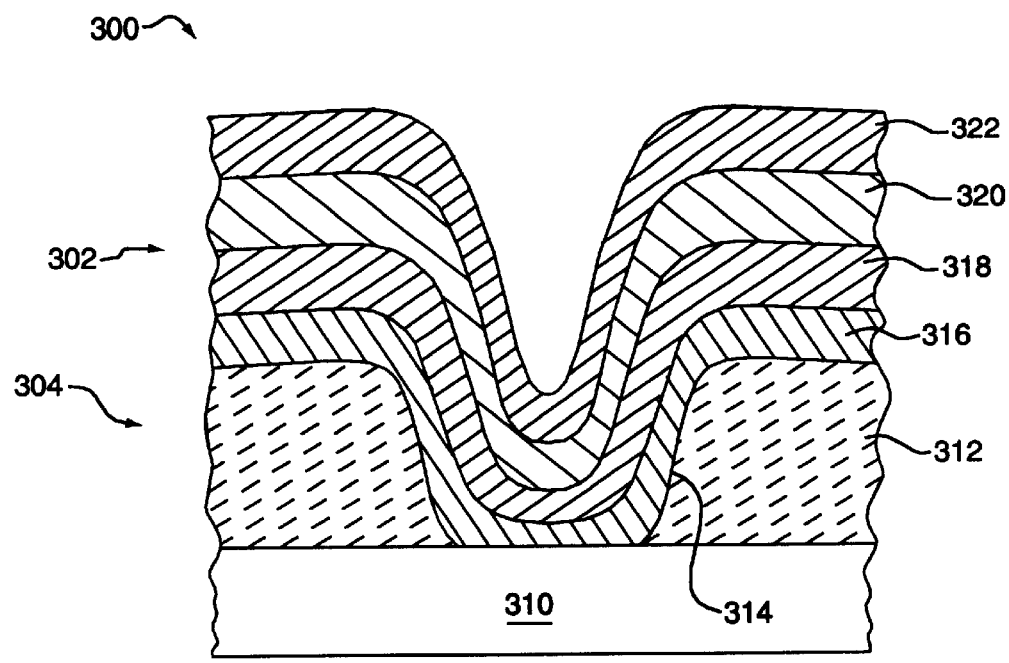
FIG. 3 depicts an integrated circuit portion containing a layered stack having Ti and TiN layers fabricated using a method in accordance with the invention.

FIG. 3 depicts an integrated circuit portion 300 containing a layered stack 302 having Ti and TiN layers that may be fabricated on a wafer 304 using a method in accordance with the invention. IC portion 300 comprises wafer substrate 310, typically comprising single crystalline silicon, but which may comprise other semiconductor or conductive materials. Insulator layer 312 typically comprises an oxide layer, such as $SiO_x$, but it may also comprise other insulator material, such as in an ILD. Insulator layer 312 has contact hole 314 extending down to wafer substrate 310. Ti contact layer 316 is disposed in contact hole 314 in contact with wafer substrate 310. TiN barrier layer 318 is located on Ti layer 316. Conducting layer 320, typically an Al alloy metallization layer, is disposed on TiN barrier layer 318. Finally, a TiN anti-reflective coating ("ARC") layer 322 covers conducting layer 320.

Figure 4:
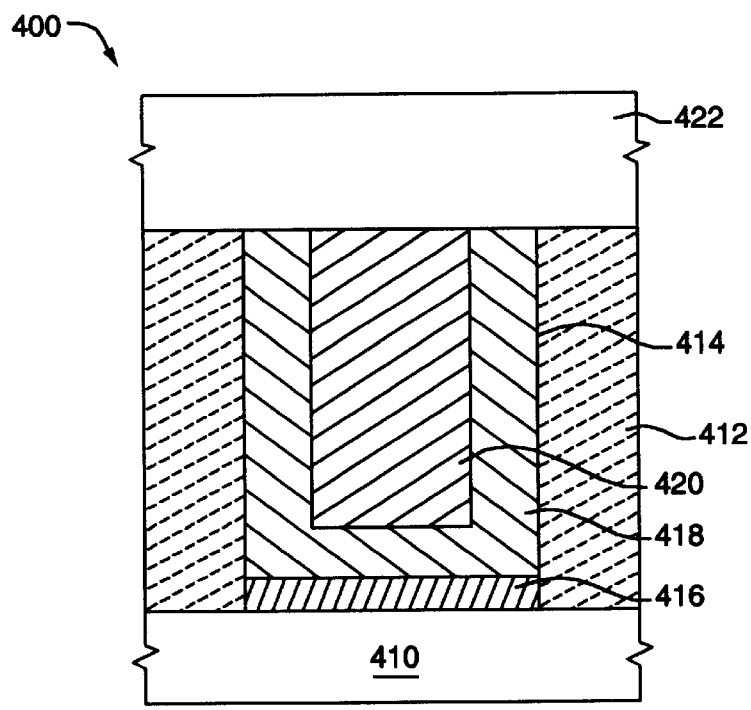
FIG. 4 depicts an integrated circuit portion comprising a via with a Ti liner layer and a TiN barrier layer fabricated using a method in accordance with the invention.

FIG. 4 depicts an IC portion 400 comprising a via having a Ti liner layer and a TiN barrier layer fabricated using a method in accordance with the invention. IC portion 400 comprises a conductive or semiconductive substrate 410 on which insulating layer 412 is disposed. A via 414 contains Ti liner layer 416, TiN barrier layer 418 and tungsten plug 420. Tungsten plug 420 provides electrical connection through via 414 between substrate 410 and conductive layer 422.

Figure 5:
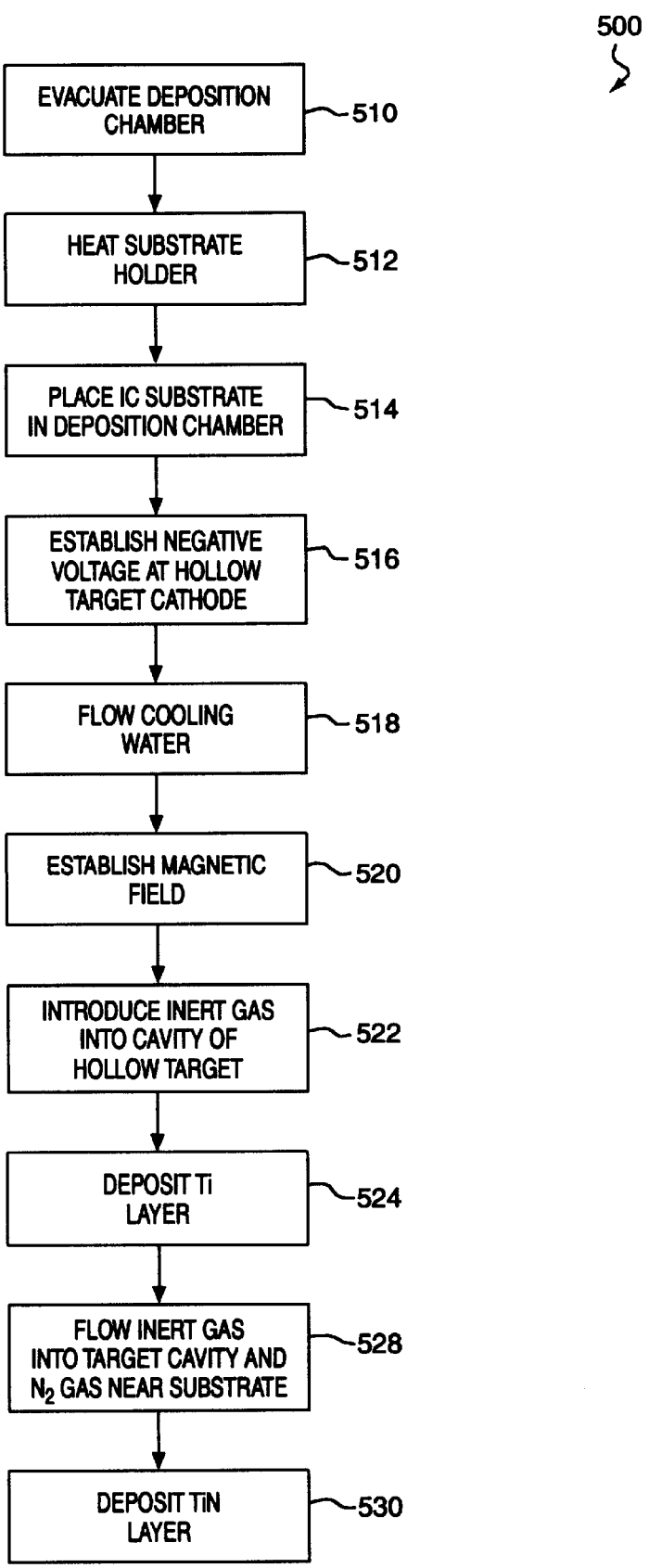
FIG. 5 shows a process flow sheet of a generalized method in accordance with the invention for forming a Ti layer and a TiN layer in the same deposition chamber using the same Ti target in a NNM, without use of either a collimator or a shutter.

FIG. 5 shows a process flow sheet of a generalized method in accordance with the invention for forming a Ti layer and a TiN layer in the same deposition chamber using the same Ti target in a NNM, without use of either a collimator or a shutter. The method of flowsheet 500 is described here with reference to FIGS. 1, 2 and 4, although it is understood that methods in accordance with the invention may be applied to a large variety of structures using a variety of HCM assemblies without departing from the inventive concepts. Also, the order of some of the process steps as outlined in FIG. 5 may be changed.

In step 510 of generalized method 500, the deposition chamber is evacuated down to a sufficiently low pressure, for example, $10^{-5}$ torr or less. In step 512, substrate holder 150 is heated to a "stage" temperature, typically in a range of from 250° to 350° C., preferably about 300° C. In step 514, the substrate wafer to be processed is placed on substrate holder 150 so that it is heated up to or near the stage temperature. The source-to-substrate spacing, that is, the distance between end 118 of hollow target cathode 110 and substrate 152 is in a range of from 215 to 240 mm, preferably about 237 mm. In step 516, a negative DC voltage, typically in a range of from –400 V to –500 V, is applied to hollow target cathode 110. The power applied to the HCM apparatus is typically in a range of from 20 to 36 kW, and preferably about 30 kW. In step 518, cooling water is flowed at sufficient temperature and flowrate to maintain the temperature of the target cathode during the deposition process in a range of 95° to 285° C. In step 520, a DC current in a typical range of from 0.05 to 1.0 amps, preferably about 0.2 to 0.25 A, at about 80–120 volts is flowed through electromagnetic coil 172 to influence magnetic field lines 210 and magnetic null region 212, as described above. In step 522, inert plasma-forming gas, such as argon, is introduced into the evacuated deposition chamber at a flowrate in a range of from 45 to 140 sccm, and preferably about 90 sccm, raising the pressure in the chamber to 1–5 millitorr, for example. The argon gas is introduced directly into cavity region 114 through inlet 120 so that it is present in greatest concentration where the plasma discharge is to be initiated. A plasma discharge is created as a result of the high negative voltage on hollow target cathode 110. The plasma is concentrated by the magnetic field lines 210 primarily into an area adjacent to a surface of target cathode 120. Gas ions are formed in the plasma and strike the surface of the sputter target cathode, causing neutral Ti-atoms to be ejected from the surface of the target. Neutral Ti-atoms are converted to Ti-ions through electron-removing collisions with other gas atoms in the plasma. Generally speaking, the direction of travel of an ejected atom may be in any random direction. Ti-ions having a velocity substantially normal to the plane of substrate 152 exit the cavity region 114 through magnetic null region 212 and impinge on substrate surface 153, forming a Ti layer. The deposition rate is typically greater than 80 nm/min. As a result, deposition of a Ti liner layer 416 with a typical thickness of 25 nm in step 524 is completed in about 17 seconds. During deposition step 524, the DC current flowed through electromagnetic coil 172 is preferably about 0.25 A at about 80–120 volts. To begin deposition of TiN, $N_2$ is flowed into the deposition chamber near the substrate through nitrogen gas inlet 154 at a flowrate typically in a range of from 24 to 36 sccm, preferably about 28 sccm. Inert gas flow into cavity region 114 is typically increased during TiN deposition from its value during Ti-deposition steps 522 and 524. When argon gas is used, its flowrate is in a range of from 45 to 140 sccm, preferably about 135 sccm. In step 530, nitrogen atoms combine with Ti-ions at the substrate, forming a TiN layer. The deposition rate of TiN is typically greater than 70 nm/min. As a result, deposition of a TiN barrier layer 418 with a typical thickness of 50 nm in step 526 is completed in about 43 seconds. During deposition step 530, the DC current flowed through electromagnetic coil 172 is preferably about 0.19 A at about 80–120 volts.

EXAMPLE 1

A TiN/Ti stack was deposited on a series of planar integrated circuit wafers, each having a $SiO_x/Si$ substrate, forming $TiN/Ti/SiO_x/Si$ stacks. The TiN/Ti stacks were formed in the same HCM deposition chamber using the same titanium hollow target cathode in accordance with the invention without using a collimator or a shutter. The preferred operating conditions as discussed with reference to FIG. 5 were used. RBS measurements were conducted on an intermediate wafer; namely, the 23rd wafer processed. The atom-percent of elements measured in several depth ranges are presented in Table 1.

TABLE 1

| Depth (nm) | N | O | Si | Ti | N/Ti |
|---|---|---|---|---|---|
| <24 | 50.0 | — | — | 50.0 | 1.00 |
| 24–41 | 47.5 | — | — | 52.5 | 0.90 |
| 41–65 | — | — | 2.0 | 98.0 | — |
| 65–545 | — | 66.7 | 33.3 | — | — |
| >545 | — | — | 100 | — | — |

The data in Table 1 at depth of 41–65 nm and 65–545 nm show that there is no residual $N_2$ at the $Ti/SiO_x$ interface, and therefore, no nitriding of the titanium target. The ratio N/Ti at depths <24 nm and 24–41 nm is approximately 1, indicating that the deposited TiN layer is sufficiently nitrided. The data for the 10 TiN/Ti interface at depths 24–41 nm and 41–65 nm show that the Ti and TiN depositions are clearly separate.

There has been described a novel method for depositing Ti and TiN layers on an integrated circuit substrate in the same PVD chamber using the same titanium target in NNM, without use of either a shutter or a collimator. A method in accordance with the invention is particularly useful for filling vias and contact holes having high aspect ratios. The novel method uses a hollow-cathode magnetron technique. It should be understood that the particular embodiments shown in the drawings and described within this specification are for purposes of example and should not be construed to limit the invention, which will be described in the claims below. It is also evident that the steps recited may, in some instances, be performed in a different order; or equivalent structures and processes may be substituted for the structures and processes described. Consequently, the invention is to be construed as embracing each and every novel feature and novel combination of features present in and/or possessed by the fabrication methods and compositions described.

What is claimed is:

1. A method of forming a Ti layer and a TiN layer on an integrated circuit substrate in a single PVD deposition chamber, comprising steps of:

creating a first magnetic field in a cavity region of a hollow cathode target containing titanium, wherein said cavity region has an opening and said magnetic field has a magnetic null region near the opening;

forming a plasma with an inert gas in said cavity region;

sputtering titanium from said hollow cathode target to form a plasma beam containing titanium that flows toward the substrate in said deposition chamber;

sputtering titanium from said hollow cathode target to form a plasma beam containing titanium that flows toward the substrate and simultaneously flowing a nitrogen-containing gas into said deposition chamber; and creating a second magnetic field between the magnetic null region and the substrate for adjusting the spread of the plasma beams.

2. A method as in claim 1, characterized in that said single deposition chamber does not contain either a collimator or a shutter.

3. A method as in claim 1, further comprising heating said substrate.

4. A method as in claim 1, further comprising applying an amount of power in a range of from 20 to 36 kilowatts to said hollow target cathode.

5. A method as in claim 1, wherein said hollow target cathode and said substrate are separated by a distance of from 215 to 240 mm.

6. A method as in claim 1, wherein adjusting the spread of the plasma beams includes modifying a remnant reversing magnetic field between the magnetic null region and the substrate.

7. A method as in claim 1, wherein the step of creating a second magnetic field between the magnetic null region and the substrate includes supplying DC electrical current to an electromagnetic coil, said electromagnetic coil disposed between the magnetic null region and the substrate.

8. A method as in claim 7, further including a step of varying the DC current through said electromagnetic coil.

9. A method as in claim 7 wherein said DC current is in a range of from 0.05 amps to 1.0 amps at about 80 volts to 120 volts.

10. A method as in claim 9 wherein said DC current is in a range of from 0.15 amps to 0.30 amps.

11. A method as in claim 1, characterized in that neither a collimator nor a shutter is used in the deposition chamber.

12. A method as in claim 1, characterized in that the steps of sputtering titanium from the hollow cathode target are conducted in a non-nitrided mode.

* * * * *